United States Patent [19]
Tomiya et al.

[11] Patent Number: 6,069,367
[45] Date of Patent: May 30, 2000

[54] SEMICONDUCTOR ELEMENT AND SEMICONDUCTOR LIGHT-EMITTING AND SEMICONDUCTOR PHOTORECEPTOR DEVICES

[75] Inventors: Shigetaka Tomiya; Satoru Kijima; Hiroyuki Okuyama; Satoshi Taniguchi; Hironori Tsukamoto, all of Kanagawa, Japan

[73] Assignee: Sony Corporation, Tokyo, Japan

[21] Appl. No.: 09/339,848

[22] Filed: Jun. 25, 1999

[30] Foreign Application Priority Data

Jun. 29, 1998 [JP] Japan .................................. 10-182276

[51] Int. Cl.[7] .......................... H01L 29/06; H01L 31/072; H01L 31/109; H01L 31/0328; H01L 31/0336
[52] U.S. Cl. ................................. 257/22; 257/21; 257/96; 257/97; 257/184; 257/201
[58] Field of Search .................................. 257/13, 15, 21, 257/22, 85, 96, 97, 103, 184, 201; 372/45

[56] References Cited

U.S. PATENT DOCUMENTS 5,442,204  8/1995  Mengz ..................................... 257/103
5,521,396  5/1996  Shakuda ..................................... 257/15
5,828,086  10/1998  Ishibashi et al. .......................... 257/94
5,900,642  5/1999  Nakatsu et al. ............................ 257/25

*Primary Examiner*—Ngân V. Ngô
*Attorney, Agent, or Firm*—Hill & Simpson

[57] ABSTRACT

The purpose of the present invention is to provide a semiconductor light-emitting element that can reduce an operational voltage by improving a contact construction with a p-side electrode. An n-type clad layer, a first guide layer, an active layer, a second guide layer, a p-type clad layer, a ZnSSe cap layer, a ZnSe cap layer, a compositional gradient super-lattice layer, and a low defect contact layer are sequentially laminated on an n-type substrate. The compositional gradient super-lattice layer is formed by alternately laminating p-type ZnTe layers and p-type ZnSe layers. The p-type ZnTe layers are formed to be thickened toward the side of the low defect contact layer. The thickness of the low defect contact layer must be 5 nm or less. Relaxing lattice distortion reduces defect density of the low defect contact layer. Accordingly, the increase in the operational voltage immediately after energization is suppressed, and the operational voltage becomes lower.

3 Claims, 6 Drawing Sheets

SEMICONDUCTOR ELEMENT AND SEMICONDUCTOR LIGHT-EMITTING AND SEMICONDUCTOR PHOTORECEPTOR DEVICES

BACKGROUND OF THE INVENTION

1. Field of the Invention

The present invention relates to a semiconductor element comprising a first layer with ZnSe as a body crystal and a second layer with ZnTe as a body crystal. More particularly, the invention relates to semiconductor light-emitting and semiconductor photoreceptor devices consisting of a II-VI family compound semiconductor.

2. Description of the Related Art

Recently, there is a demand for developing a blue or green, light emittable semiconductor light-emitting element as a light source for a high-density optical disk device, a high-density magneto-photo disk device, a full-color display device, a photo-chemical reaction processor, or a medical apparatus, for example.

Preferably, a II-VI family compound semiconductor consisting of at least one kind of II family chemical elements including zinc (Zn), magnesium (Mg), beryllium(Be), cadmium (Cd), mercury (Hg) and manganese (Mn) and at least one kind of VI family chemical elements including oxygen (O), sulfur (S), selenium (Se) and tellurium (Te) is used as a material constructing a green or blue light-emittable semiconductor light-emitting element. Particularly, crystal growth of a ZnMgSSe mixed crystal, a quaternary mixed crystal, is possible on a substrate consisting of GaAs which has excellent crystallinity and can be obtained easily. Also, the ZnMgSSe mixed crystal is known as a material constructing a guide layer and a clad layer of a semiconductor light-emitting element (Electronics Letters 28 (1992, p.1798, for example.)

Conventionally, a semiconductor light-emitting element using this kind of a II-VI family compound semiconductor, particularly, a semiconductor light-emitting element using a ZnMgSSe mixed crystal in a clad layer is generally constructed by sequentially laminating a clad layer consisting of an n-type ZnMgSSe mixed crystal, an active layer consisting of a ZnCdSe mixed crystal, a clad layer consisting of a p-type ZnMgSSe mixed crystal and a cap layer consisting of a p-type ZnSe sandwiching a buffer layer on a substrate consisting of n-type GaAs, and then, connecting a p-side electrode to the cap layer and an n-side electrode to the substrate. However, it is difficult to increase carrier concentration of a p-type ZnSe constructing the cap layer with this semiconductor light-emitting element. Thus, it becomes difficult to obtain ohmic contact with the p-side electrode.

To resolve the problem, a technology has been developed which consists steps of forming a super-lattice layer in which a p-type ZnTe layer and a p-type ZnSe layer are laminated alternately on the cap layer, forming an about 50 nm thick contact layer consisting of p-type ZnTe that can obtain high carrier concentration thereon, and then connecting a p-side electrode which consists of a palladium(Pd) layer, a platinum(Pt) layer, and metallic (Au) layer being sequentially laminated to the contact layer. This contact construction improves an ohmic contact characteristic with a p-side electrode substantially. Successive oscillation at room temperature has been achieved in a semiconductor light-emitting element with a Separate Confinement Heterostructure, SCH, construction in which a ZnCdSe mixed crystal is used as an active layer, a ZnSSe mixed crystal as a guide layer, and a ZnMgSSe mixed crystal as a clad layer (Jpn. J. Appl. Phys. 33 (1994) p. L938, for example.)

However, a conventional semiconductor element using this kind of contact construction causes a rapid increase in an operational voltage of 7–8V immediately after energization. To clarify its cause, a sectional construction of a semiconductor light-emitting element was observed through a transmission electron microscope, TEM. As shown in FIG. 1, it has been understood that high-density unmatched dislocation 130 of $3.2 \times 10^{14}/cm^2$ occured on an interface between a super-lattice layer 120 and a contact layer 121. Also, it has been understood that a laminated layer defect 131 and a through-dislocation 132 were formed densely in the contact layer 121. In other words, a dislocation core of the unmatched dislocation 130 works as a hole-trap immediately after energization and a depletion layer is caused on interface between the super-lattice layer 120 and the contact layer 121, which may leads the increase in the operational voltage. The conventional semiconductor light-emitting element can not operate with a low voltage. Therefore, its life can not be extended, and its reliability cannot be improved.

As in the above description of a semiconductor light-emitting device using a II-VI family compound semiconductor, if a blue or green light-emittable semiconductor light-emitting element becomes practical, sufficient characteristics cannot be obtained with a photo-diode using a conventional silicon (Si.) Therefore, development of photo-diode using a II-VI family compound semiconductor has been demanded, but the ploblem of a contact construction with a p-side electrode must be resolved, just as in the case with semiconductor light emitting device.

SUMMARY OF THE INVENTION

In view of those problems, it is the first objective of the present invention is to provide semiconductor element which can reduce a defect density of a second layer consisting of ZnTe formed on a first layer consisting of ZnSe sandwiching a compositional gradient super-lattice layer It is the second objective of the present invention to provide a semiconductor light-emitting element which can lower an operational voltage by improving a contact construction with a p-side electrode.

It is the third objective of the present invention to provide a highly reliable and highly quantum-efficient semiconductor photoreceptor device by improving the contact construction with the p-side electrode.

A semiconductor element includes a first layer whose body crystal is ZnSe, a compositional gradient super-lattice layer which is placed adjacent to the first layer, in which a ZnTe layer whose body crystal is ZnTe and a ZnSe layer whose body crystal is ZnSe are alternately laminated more than two layers for each couples of layers, wherein the thickness of at lease one of ZnTe layer and ZnSe layer varies in the direction of laminated layers to have a compositional difference, and a second layer which is placed adjacent to the compositional gradient super-lattice layer, wherein the second layer is consisting of a ZnTe body crystal and is 5 nm or less in thickness.

A semiconductor light-emitting element in which an n-type clad layer, an active layer, a p-type clad layer comprising at least one kind of II family chemical elements including zinc (Zn), magnesium (Mg), beryllium (Be), cadmium (Cd), mercury (Hg) and manganese (Mn) and at least one kind of VI family chemical elements including oxygen (O), sulfur (S), selenium (Se) and tellurium (Te) are at least sequentially laminated. Its p-side electrode is electrically connected against a p-type clad layer. The semiconductor light-emitting element includes a ZnSe cap layer which is placed between the p-type clad layer and the p-side electrode and consisting of p-type ZnSe, a compositional gradient super-lattice layer which is placed adjacent to the ZnSe cap layer and between the ZnSe cap layer and the p-side electrode, wherein the thickness of at least one side of each p-type ZnTe layer or p-type ZnSe layer varies in the direction of laminated layers to have a compositional slope, and a low defect contact layer which is placed adjacent to the compositional gradient super-lattice layer and between the compositional gradient super-lattice layer and the p-side electrode, wherein the low defect contact layer consists of p-type ZnTe and is 5 nm or less in thickness.

A semiconductor photoreceptor device according to the present invention which comprises an n-type layer, an I layer, a p-type layer comprising at least one kind of II family chemical elements including zinc (Zn), magnesium (Mg), beryllium(Be), cadmium (Cd), mercury (Hg) and manganese (Mn) and at least one kind of VI family chemical elements including oxygen (O), sulfur (S), selenium (Se) and tellurium (Te) are at least sequentially laminated. A p-side electrode is electrically connected to the p-type clad layer. The semiconductor photoreceptor device includes a ZnSe cap layer which is placed between the p-type layer and the p-side electrode and consisting of p-type ZnSe, a compositional gradient super-lattice layer which is placed adjacent to the ZnSe cap layer and between the ZnSe cap layer and the p-side electrode, wherein the p-type ZnTe layer and p-type ZnSe layer are laminated alternately at least two layers for each couple of layers, and the thickness of at lease one side of each ZnTe layer or ZnSe layer varies in the direction of laminated layers to have a compositional slope, and a low defect contact layer which is placed adjacent to the compositional gradient super-lattice layer and between the compositional gradient super-lattice layer and the p-side electrode, wherein the low defect contact layer consists of p-type ZnTe to which p-type impurities are added and is 5 nm or less in thickness.

In the semiconductor element according to the present invention, the second layer is laminated on the first layer sandwiching the compositional gradient super-lattice layer. The thickness of the second layer is 5 nm or less in thickness, and the second layer has a lower defect density here.

A semiconductor light-emitting element according to the present invention emits light by injecting current from a p-side electrode through a low defect contact layer into an active layer. The low defect contact layer is formed adjacent to a compositional-gradient super-lattice layer, and the thickness of the low defect contact layer is equal to or less than 5 nm here. Thus, the defect density of the low defect contact layer is reduced and an increase in an operational voltage is suppressed.

A semiconductor photoreceptor device according to the present invention causes electron-positive hole pairs by light absorbed mainly in a I layer to cause current which travels from an n-type layer through a p-type layer and the low defect contact layer to the p-side electrode. The low defect contact layer is formed adjacent to a compositional-gradient super-lattice layer, and the thickness of the low defect contact layer is 5 nm or less in thickness here. Thus, the defect density of the low defect contact layer is reduced, and a high quantum efficiency and high reliability can be obtained.

DETAILED DESCRIPTION OF THE PREFERRED EMBODIMENTS

The embodiments of this invention will be described in further detail by way of example with reference to the accompanying drawings.

Embodiment 1

Figure 1:
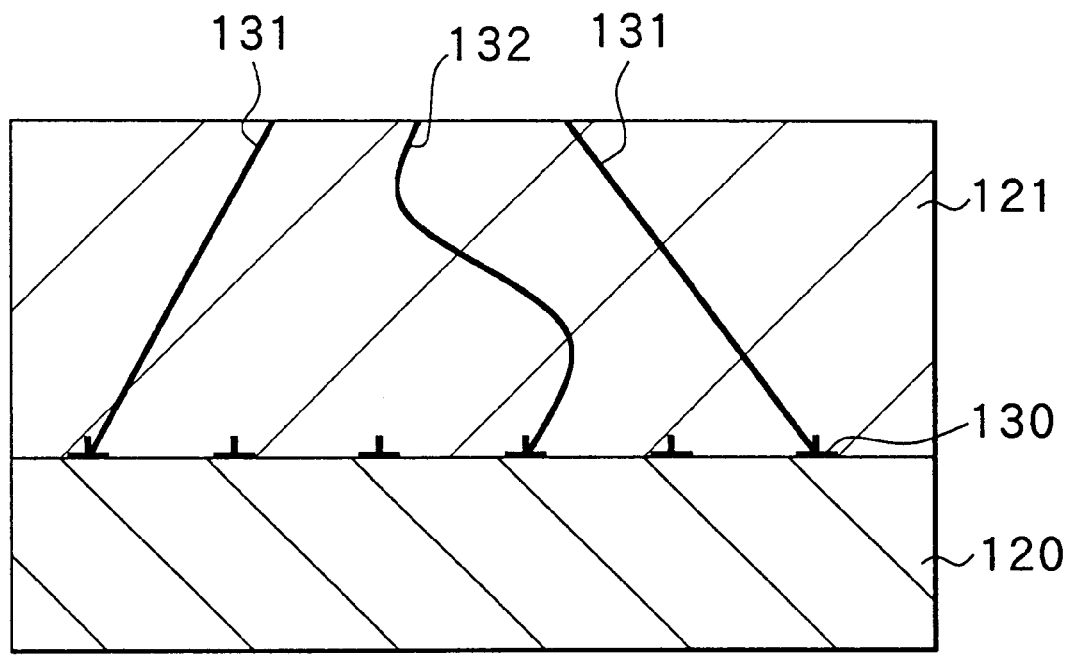
FIG. 1 is a sectional view used for describing a conventional semiconductor light-emitting element.
Figure 2:
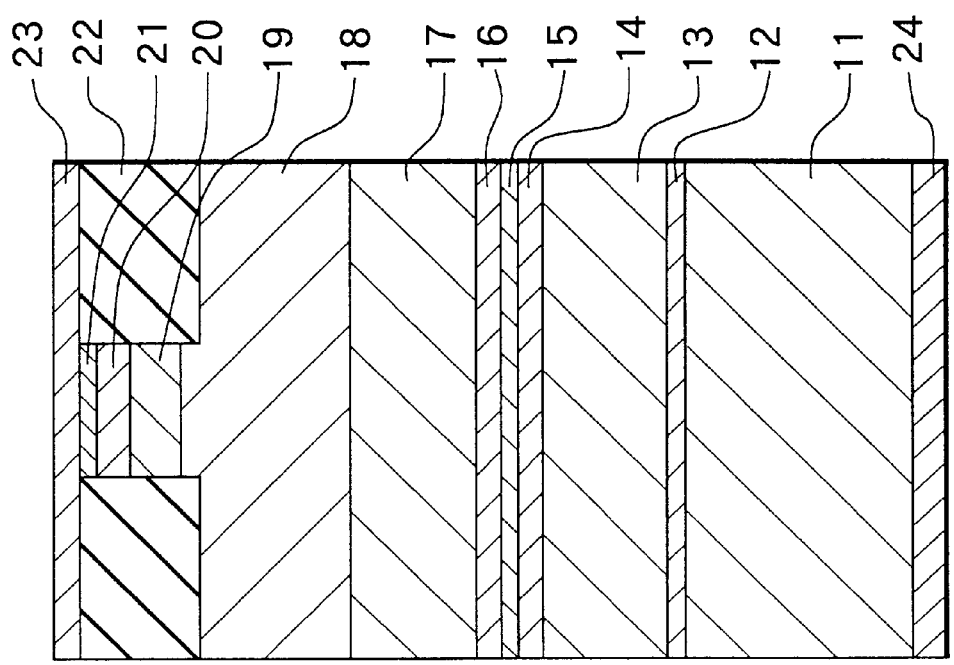
FIG. 2 is a sectional view showing a construction of a laser diode according to the first embodiment of the present invention.

FIG. 2 shows a sectional structure of a laser diode which is a semiconductor light-emitting element according to the first embodiment of the present invention. This laser diode consists of a buffer layer 12, an n-type clad layer 13, a first guide layer 14, an active layer 15, a second guide layer 16, a p-type clad layer 17, a ZnSSe cap layer 18, ZnSe cap layer 19, a compositional gradient super-lattice layer 20 and a low defect contact layer 21, which are sequentially laminated on one side of a substrate 11.

The substrate 11 is, for example, 100–350 $\mu$m in thickness (in the direction of laminated layers) and composed of n-type GaAs with silicon (Si) as an n-type impurity. The buffer 12 is, for example, laminated on a (001) side of this substrate 11. For example, the buffer 12 is 10 nm in thickness and composed of n-type ZnSe with chlorine (Cl) as an n-type impurity. The n-type clad layer 13 is, for example, 1 $\mu$m in thickness and composed of n-type ZnMgSSe mixed crystal with chlorine (Cl) as an n-type impurity.

The first guide layer 14 is, for example, 100 nm in thickness and composed of n-type ZnSSe mixed crystal with chlorine (Cl) as an n-type impurity or without any impurity. This ZnSSe mixed crystal in the VI family chemical element is composed of 6% (mole %) sulfur and 94% selenium. Its lattice constant is equal to a lattice constant of GaAs constructing the substrate 11.

The active layer 15 is, for example, composed of ZnCdSe mixed crystal with 3–4 nm in thickness single quantum well structure. This ZnCdSe mixed crystal in the II family chemical element is composed of 75% zinc and 25% cadmium. Its lattice constant is a little bigger than the one of GaAs constructing the substrate 11.

The second guide layer 16 is, for example, 100 nm in thickness and composed of ZnSSe mixed crystal with nitrogen (N) as p-type impurities or without any impurity. This ZnSSe mixed crystal in the VI family chemical element is composed of 6% sulfur and 94% selenium. The p-type clad layer 17 is, for example, 1 $\mu$m in thickness and composed of a p-type ZnMgSSe mixed crystal with nitrogen as a p-type impurity.

The ZnSSe cap layer 18 is, for example, 1.5 $\mu$m in thickness and composed of a p-type ZnSSe mixed crystal with nitrogen as a p-type impurity. Preferably, this p-type ZnSSe mixed crystal in the VI family chemical element is composed of 6% sulfur and 94% selenium so that it matches with the GaAs lattice constant constructing the substrate 11. The ZnSe cap layer 19 is 100 nm in thickness, for example, and composed of p-type ZnSe with nitrogen as a p-type impurity.

Figure 3:
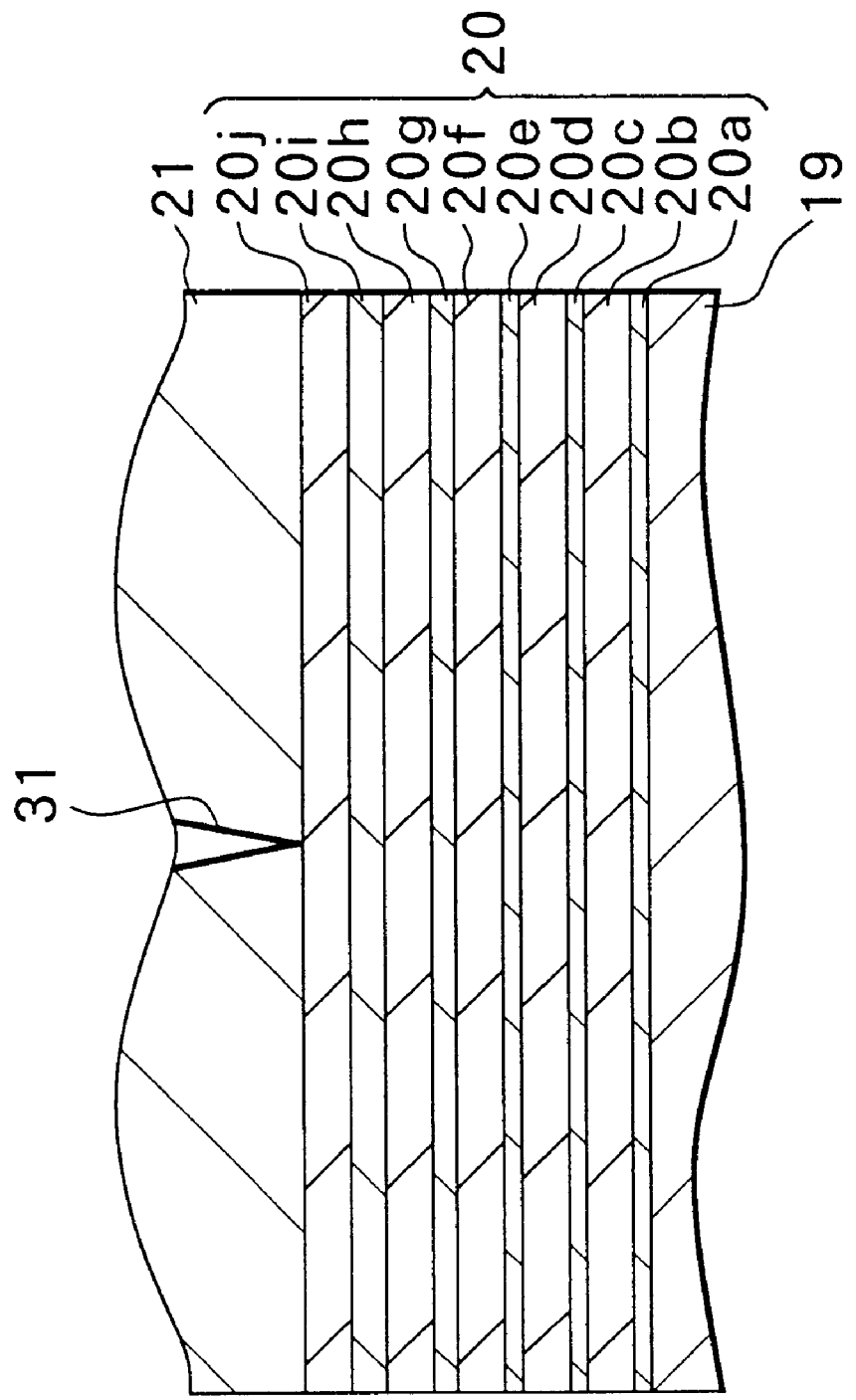
FIG. 3 is a sectional view showing enlarged part of a compositional gradient super-lattice layer and a low defect contact layer of the laser diode shown in FIG. 2.

FIG. 3 shows enlarged part of the compositional gradient super-lattice layer 20. The compositional gradient super lattice layer 20 is composed of p-type ZnTe layers 20a, 20c, 20e, 20g and 20i to which nitrogen is added as a p-type impurity, and p-type ZnSe layers 20b, 20d, 20f, 20h and 20j to which nitrogen is added as a p-type impurity by being laminated by two or more layers alternately. (In FIG. 3, those layers are laminated by five layers.) Each of P-type ZnTe layers 20a, 20c, 20e, 20g and 20i and p-type ZnSe layers 20b, 20d, 20f, 20h and 20j, which constructs the compositional gradient super-lattice layer 20, has a quantum structure. This compositional gradient super-lattice layer 20 reduces resistance caused by discontinuity of a valence electron zone between ZnSe constructing the ZnSe cap layer 19 and ZnTe constructing the low defect contact layer 21 described later to lower operational voltage.

Also, the compositional gradient super-lattice layer 20 relieves lattice distortion caused by a big difference between the lattice constant of ZnSe constructing the ZnSe cap layer 19 and the lattice constant of ZnTe constructing the low defect contact layer 21 described later. Primarily, the difference of lattice constants between ZnSe and ZnTe is about 7%. Therefore, if the low defect contact 21 of ZnTe is laminated adjacent to the ZnSe cap layer 19, the critical thickness of the low defect contact layer 21 is extremely thin as much as 10 molecular layers. Substantially, it can not prevent occurrence of a defect. Theoretically, in this case, unmatched dislocation is brought on the interface between the ZnSe cap layer 19 and the low defect contact layer 21 with about 5.4 nm interval each. Here, the relaxation of lattice distortion provided by the compositional gradient super-lattice 20 reduces the number of defects brought to the low defect contact layer 21.

In the compositional gradient super-lattice layer 20, at least one side of p-type ZnTe layers 20a, 20c, 20e, 20g and 20i or p-type ZnSe layers 20b, 20d, 20f, 20h and 20j varies in the direction of laminated layers; The composition is gradient in the direction of laminated layers as a whole. From the ZnSe cap layer 19, the p-type ZnTe layer 20a of 0.3 nm in thickness, the p-type ZnSe layer 20b of 1 nm in thickness, the p-type ZnTe layer 20c of 0.3 nm in thickness, the p-type ZnSe layer 20d of 1 nm in thickness, the p-type ZnTe layer 20e of 0.3 nm in thickness, the p-type ZnSe layer 20f of 1 nm in thickness, the p-type ZnTe layer 20g of 0.45 nm in thickness, the p-type ZnSe layer 20h of 1 nm in thickness, the p-type ZnTe layer 20i of 0.6 nm in thickness and the p-type ZnSe layer 20j of 1 nm in thickness are laminated in order.

In other words, the thickness of each p-type ZnSe layers 20b, 20d, 20f, 20h and 20j are the same while the thickness of each p-type ZnTe layers 20a, 20c, 20e, 20g and 20i varies. Thus, the side of the low defect contact layer 21 is thicker than the side of the ZnSe cap layer 19. Therefore, the whole composition of the compositional gradient super-lattice layer 20 is inclined such that the compositional ratio of tellurium gets bigger and bigger from the side of ZnSe cap layer 19 to the side of the low defect contact layer 21. The construction of compositional gradient super-lattice layer 20 shown here is ideal for relaxing the valence electron discontinuity between the ZnSe cap layer 19 and the low defect contact layer 21.

The low defect contact layer 21 is, for example, 1 or more atomic layer (about 0.28 nm) or more and 5 nm or less in thickness. It is composed of p-type ZnTe to which nitrogen is added as a p-type impurity. ZnTe of the low defect contact layer 21 allows to get high carrier concentration enough to obtain an ohmic contact with the p-side electrode. Also, the low defect contact layer 21 of 5 nm or less in thickness reduces effects of the lattice distortion due to the big difference between the lattice constant of ZnSe constructing the ZnSe cap layer 19 and the one of the ZnTe constructing the low defect contact layer 21, as described by referring to the compositional gradient super-lattice layer 20.

To describe the relationship between the thickness of the low defect contact layer 21 and the degree of the relaxation of the lattice distortion by inserting the compositional gradient super-lattice layer 20, the expression (1) is defined below as the difference $R_{diff}$ of the lattice relaxation.

$$R_{diff} = \frac{S_{this} - S_{direct}}{S_{direct}} \times 100 \qquad (1)$$

The $S_{this}$ indicates a lattice distortion, which is a total lattice distrotion of the laser diode of the compositional gradient super-lattice layer 20 and the low defect contact layer 21, i.e., a lattice distortion of the laser diode when the low defect contact layer 21 is laminated on the ZnSe cap layer 19 sandwiching the compositional gradient super-lattice layer 20. $S_{direct}$ indicates a lattice distortion of the low defect contact layer 21, i.e., a lattice distortion in direct lamination, when the low defect contact layer 21 is laminated on the ZnSe cap layer 19 directly.

The lattice distortion $S_{this}$ of the laser diode and the lattice distortion $S_{direct}$ in direct lamination are computed by the expression (2), respectively.

$$S = \frac{\sum_i \frac{(a_i - a_{ref})}{a_{ref}} \times d_i}{\sum_i d_i} \qquad (2)$$

Where $a_i$ is a lattice constant of the $i^{th}$ layer from the ZnSe cap layer 19, $a_{ref}$ is a lattice constant of a layer to be referred, and $d_i$ is thickness of the $i^{th}$ layer from the ZnSe cap layer 19. When the lattice distortion $S_{this}$ of the laser diode is computed, each of p-type ZnTe layers 20a, 20c, 20e, 20g and 20i and p-type ZnSe layers 20b, 20d, 20f, 20h and 20j of the compositional gradient super-lattice layer 20 is considered as one layer. The lattice distortion $S_{direct}$ in direct lamination is computed, where i=1, $a_i$ is a lattice constant of the low defect contact layer 21, and $d_i$ is thickness of the low defect contact layer 21.

As indicated by the experssion (1) and (2), the bigger the difference $R_{diff}$ of the lattice relaxation is, the more the lattice distortion is relaxed. Then, the difference $R_{diff}$ of the lattice relaxation was computed by using the expression (1) and (2) and varying only the thickness of the low defect contact layer 21, where the referred layer was ZnSe cap layer 19, and the referred lattice constant $a_{ref}$ was the ZnSe lattice constant, 0.56681 nm. The referred layer may be the substrate 11. However, this is an examination regarding a multiple layer film consisting of only ZnSe and ZnTe. Therefore, the ZnSe cap layer 19 were used as the referred layer here. Using the substrate 11 as the referred layer gives the same result. The lattice distortion $S_{this}$ of the laser diode was computed for the case that p-type ZnTe layers 20a, 20c, 20e, 20g and 20i and p-type ZnSe layers 20b, 20d, 20f, 20h and 20j, described as the compositional gradient super-lattice layer 20 earlier was laminated alternately.

Figure 4:
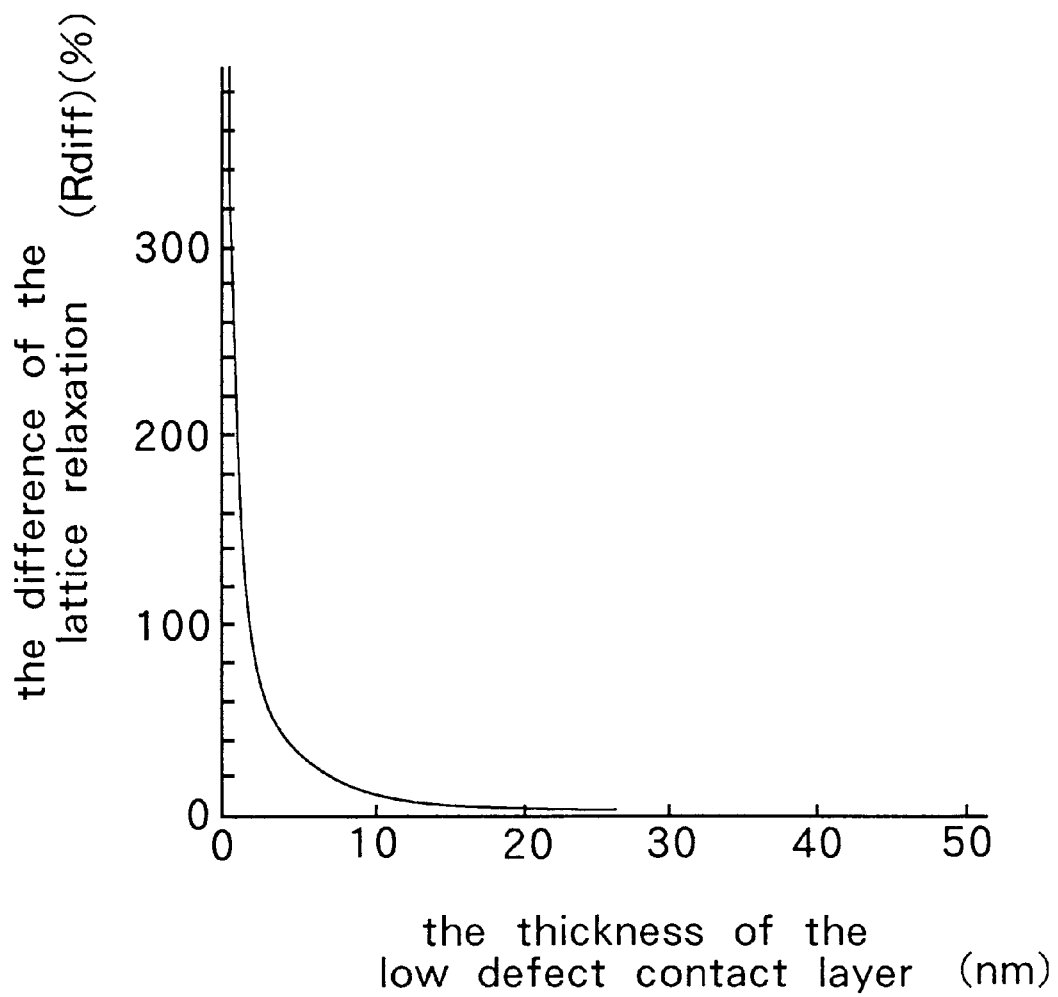
FIG. 4 is a characteristic diagram showing a relationship between the thickness of the low defect contact layer and difference $R_{diff}$ of lattice relaxation.

FIG. 4 shows the relationship between the thickness of the low defect contact layer 21 and the difference $R_{diff}$ of the degree of the lattice relief. When the thickness of the low defect contact layer 21 is bigger than 5 nm, it is almost the same as the case when the low defect contact layer 21 is laminated on the ZnSe cap layer 19 directly. Thus, it is not possible to obtain enough relaxation effect for lattice distortion caused by the compositional gradient super-lattice layer 20.

The sectional construction of the low defect contact layer 21 was observed through TEM when it was 4 nm in thickness. The compositional gradient super-lattice layer 20 was composed by laminating p-type ZnTe layers 20a, 20c, 20e, 20g and 20i and p-type ZnSe layers 20b, 20d, 20f, 20h and 20j alternately, as described earlier. As a result, as shown in enlarged part in FIG. 3, the crystal surface of the low defect contact layer 21 undulates unevenly in approximately 70 nm cycle. It was understood that a stacking fault 31 occurred only at a dent part. In other words, no other defect than this laminated defect 31 could not be observed, and the defect density of the low defect contact layer 21 was approximately $2.0 \times 10^{10}/cm^2$. Compared to the conventional one, it was reduced as much as about four orders.

As shown in FIG. 2, each of the low defect contact layer 21, the compositional gradient super-lattice layer 20 and the ZnSe cap layer 19 is extended in the direction of <110> (in the vertical direction in FIG. 2) to form 10 µm, for example, belt-like shapes. Those shapes construct a current narrow portion. The insulating layer 22 consisting of aluminum oxide ($Al_2O_3$), polyimide and the like is formed in the area of the ZnSSe cap layer 18 without each of the ZnSe cap layer 19, the compositional gradient super-lattice layer 20 and the low defect contact layer 21 at the side of the ZnSe cap layer 19.

At the opposite side of the substrate 11 of the insulating layer 22 and the low defect contact layer 21, the p-side electrode 23 is equipped which is formed by sequentially laminating and heat processing, for example, a palladium layer, platinum layer and metallic layer from the side of the low defect contact layer 21. The p-side electrode 23 is connected electrically to the p-type clad layer 17 sandwiching the low defect contact layer 21, the compositional gradient super-lattice layer 20, the ZnSe cap layer 19, and ZnSSe cap layer 18, respectively. At the other side of the substrate 11, the n-side electrode 24 of indium (In), for example, is formed. The n-side electrode 24 is connected electrically to the n-type clad layer 13 sandwiching the substrate 11 and the buffer layer 12.

Though it is not shown, the laser diode also includes an edge film respectively at sides of a pair, perpendicular to the extended direction (or the direction of the length of a resonator) of the low defect contact layer 21. The edge film is formed by laminating magnesiumsilicofluride ($MgF_2$) film and zinc sulfice (ZnS) film, for example, alternately. Though it is not shown the laser diode is placed against a heat sink and is used with being enveloped with a package around for use.

The laser diode with such a construction can be manufactured as follows.

The laser diode is obtained by preparing the substrate 11 consisting of n-type GaAs first and sequentially growing the buffer layer 12 of n-type ZnSe, the n-type clad layer 13 of n-type ZnMgSSe mixed crystal, the first guide layer 14 of ZnSSe mixed crystal, the active layer 15 of ZnCdSe mixed crystal, the second guide layer 16 of ZnSSe mixed crystal, the p-type clad layer 17 of p-type ZnMgSSe mixed crystal, the ZnSSe cap layer 18 of p-type ZnSSe mixed crystal, the ZnSe cap layer 19 of p-type ZnSe, the compositional gradient super-lattice layer 20 consisting of the p-type ZnTe layers 20a, 20c, 20e, 20g and 20g, and the p-type ZnSe layers 20b, 20d, 20f, 20h, 20j, and the low defect contact layer 21 of p-type ZnTe on one side of the substrate 11, (001) according to the Molecular Beam Epitaxi, MBE, method.

The plurality of parallel belt-like mask patterns is formed which is extended toward the <110> direction by using lithography after applying a resist film, not shown, on the low defect contact layer 21. After wet-etching or dry etching using the resist film, as a mask (not shown), the low defect contact layer 21, the compositional gradient super-lattice layer 20 and ZnSe cap layer 19 are removed sequentially and selectively to form the plurality of parallel belt-like shape which is extended toward the <110> direction. Then, the insulating layer 22 is formed by forming aluminum oxide film by the vaccume evaporation method, for example, on the whole surface (ie. on the ZnSSe cap layer 18 from which the low defect contact layer 21 and the like are removed selectively and on the resist film, not shown) and removing, or lifting off, the resist film, not shown, together with aluminum oxide film formed on the resist film.

After forming the insulating layer 22, the p-side electrode 23 is formed by sequentially evaporating the palladium layer, the platinum layer and the metallic layer on the low defect contact layer 21 and the insulating layer 22 by the vacuum evaporation method, for example, and by forming the n-side electrode 24 by evaporating the indium layer on the other side of the substrate 11.

After forming the p-side electrode 23 and the n-side electrode 24, the substrate 11 is cleaved by the predetermined width (600 nm, for example) perpendicular to the direction of the length of the low defect contact layer 21 (the direction of the length of the resonator) to form the edge film on the cleaved surface. Then, the laser diode shown in FIG. 2 is formed by cleaving between each of the plurality of the belt-like low defect contact layer 21 in parallel with the direction of the length.

The laser diode manufactured as described above works as follows.

When the predetermined voltage is applied between the n-side electrode 24 and the p-side electrode 23 in the laser diode, current is injected from the p-side electrode 23 through the low defect contact layer 21, the compositional gradient super-lattice layer 20, the ZnSe cap layer 19, ZnSSe cap layer 18, and the p-type clad layer 17 to the active layer 15. Then, light-emitting is occurred by electron- positive hole re-coupling in the active layer 15. Here, the low defect contact layer 21 is placed adjacent to the compositional gradient super-lattice layer 20. Also, because the thickness of the low defect contact layer 21 is as thin as less than 5 nm, the defect density of the low defect contact layer 21 is low, and it has many hole traps. Thus, it suppresses the increase in the operational voltage especially immediately after energization.

To check the effect of the laser diode according to the present invention, time-variation of the operational voltage was examined by successive operation test. The compositional gradient super-lattice layer 20 was constructed by alternately laminating the p-type ZnTe layers 20a, 20c, 20e, 20g, 20i and the p-type ZnSe layers 20b, 20d, 20f, 20h, 20j, described earlier. The thickness of the low defect contact layer 21 was 4 nm. The successive operational examination was done under the condition of 500 $A/cm^2$ current density, stable current and room temperature.

Figure 5:
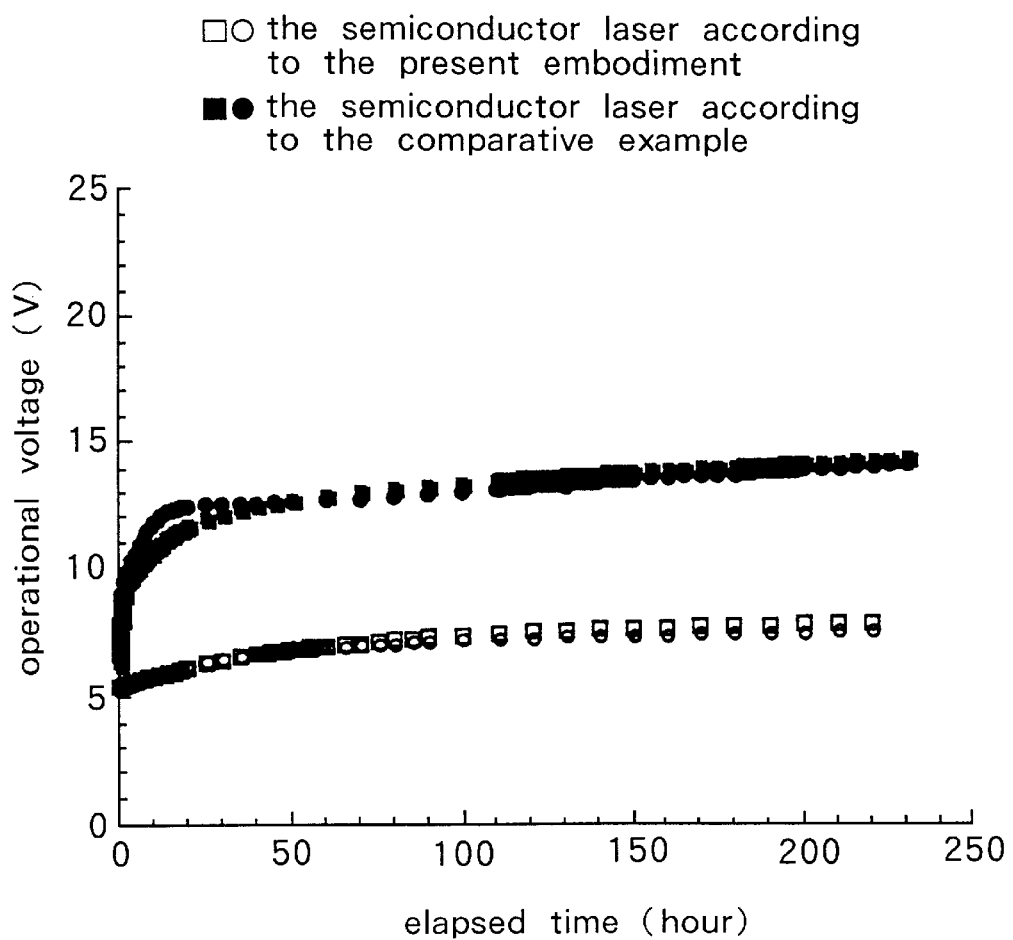
FIG. 5 is a characteristic diagram showing time-variation of an operational voltage in the laser diode shown in the FIG. 2 by comparing with the conventional laser diode.
Figure 6:
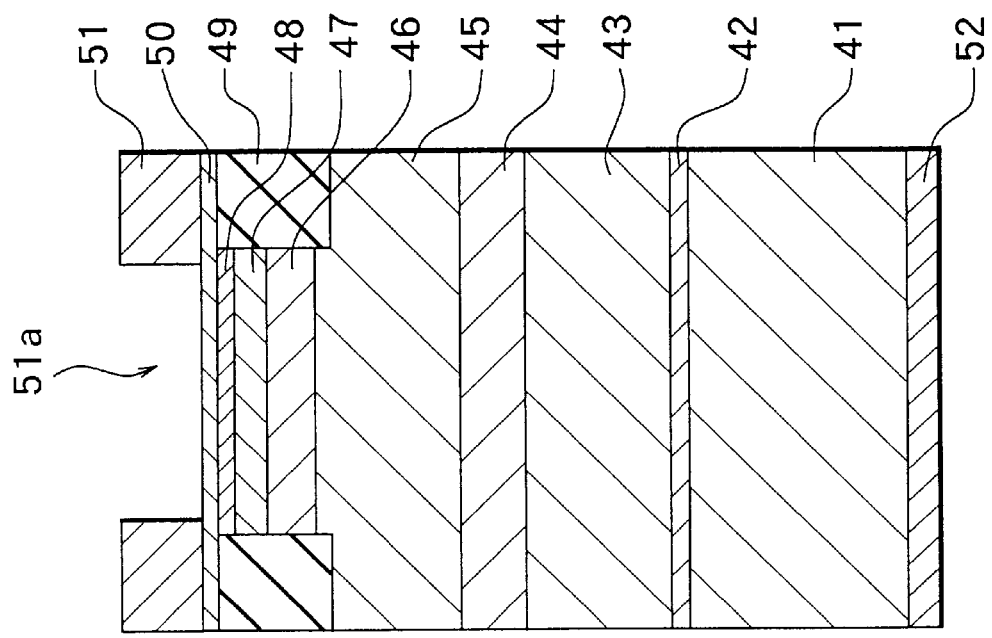
FIG. 6 is a sectional view showing composition of a photo-diode according to the second embodiment of the present invention.

FIG. 5 shows the time-variation of the operational voltage in the laser diode according to the present invention, together with the time variation of the operational voltage in the laser diode of the comparative example. The laser diode of the comparative example was the same as the laser diode according to the present invention, except that the thick ness of the low defect contact layer 21 was 50 nm. The required condition of the successive operation for the laser diode of the comparative example was also the same as the one for the semiconductor of the present invention. The laser diode of the present invention has extremely smaller increase in the operational voltage after energization compared to the conventional laser diode. It was understood that the operational voltage could be reduced by about 6V. This is because unnecessary hole traps were not occurred with low defect density of the low defect contact layer 21.

According to the laser diode of the present invention, the low defect contact layer 21 is formed adjacent to the compositional gradient super-lattice layer 20, and the thickness of the low defect contact layer 21 is 5 nm or less. Thus, the defect density of the low defect contact layer 21 becomes lower and, especially it suppresses the increase in the operational voltage after energization. Thus, the operational voltage becomes lower, which enebles the lifelong of the element to be extended. Also, it can obtain good characteristics and improve reliability.

Embodiment 2

FIG. 5 shows the construction of a photodiode that is a semiconductor photoreceptor device according to the second embodiment of the present invention. This photodiode is constructed by sequentially laminating a buffer layer 42, an n-type layer 43, an I-layer 44, a p-type layer 45, a ZnSe cap layer 46, a compositional gradient super-lattice layer 47, and a low defect contact layer 48 on one side of a substrate 41.

A substrate 41 is, for example, 100–350 $\mu$m and composed of n-type GaAs to which silicon (Si) is added as an n-type impurity. The buffer layer 42 is, for example, laminated on a (001) side of this substrate 41, for example. The buffer layer 42 is 10 nm in thickness and composed of n-type ZnSe to which chlorine (Cl) is added as an n-type impurity. The n-type clad layer 43 is, for example, 1 um in thickness and composed of n-type ZnSSe mixed crystal to which chlorine (Cl) is added as an n-type impurity.

The I layer 44 is, for example, 200 nm in thickness and composed of ZnSSe mixed crystal without any impurity. The p-type layer 45 is, for example, 1 $\mu$m in thickness and composed of p-type ZnSSe mixed crystal to which nitrogen is added as a p-type impurity. The ZnSe cap layer 46 is, for example, 100 nm in thickness and composed of p-type ZnSe to which nitrogen is added as a p-type impurity.

The compositional gradient super-lattice layer 47 has the same construction as the one of the compositional gradient super-lattice layer 20 described in the first embodiment. The p-type ZnTe layer with nitrogen as p-type impurity and p-type ZnSe layer with nitrogen as p-type impurity are laminated by two or more layers alternately and compose the compositional gradient super-lattice layer 47. Also, the thickness of at least one side of each p-type ZnTe layer or each p-type ZnSe layer varies in the laminated direction, and the whole composition is gradient in the laminated direction.

The low defect contact layer 48 has the same composition as the one of the low defect contact layer 21 described earlier in the first embodiment. The thickness of the low defect contact layer 48 is from 1 atomic layer (about 0.28) to 5 nm, and it is constructed by p-type ZnTe to which nitrogen is added as a p-type impurity.

Each pair of edges of the low defect contact layer 48, the compositional gradient super-lattice layer 47, and the ZnSe cap layer 46 are parallel in the direction of the <110> to form a square-like shape. The insulating layer 49 of aluminum oxide or polyimide is formed in the area of p-type layer 45 at the side of the ZnSe cap layer 46, with no ZnSe cap layer 46, the compositional gradient super-lattice layer 47, and the low defect contact layer 48.

On the insulating layer 49 and low defect contact layer 48, an about 10 nm thin film electrode 50 of metal is equipped such that a visible light ray can be transparent. On the thin film electrode 50, a p-side electrode 51 is equipped which is formed by sequentially laminating and heat processing a palladium layer, a platinum layer, and a metallic layer from the side of the thin film electrode 50, for example. The p-side electrode 51 has a square-like opening 51a which is a little smaller than the low defect contact layer 48. The opening 51a is corresponding to the low defect contact layer 48. Those p-side electrode 51 and the thin film electrode 50 are electrically connected to the p-type layer 45 through the low defect contact layer 48, the compositional gradient super-lattice layer 47, and the ZnSe cap layer 46, respectively. On the opposing side against one side of the substrate 41, the n-side electrode 52 of indium, for example, is equipped. The n-side electrode 52 is electrically connected to the n-type layer 43 through the substrate 41 and the buffer layer 42. The photo-diode, not shown is placed on a heat sink and used with covered by a package.

The photo-diode with such a construction can be manufactured as follows:

The photo-diode is obtained by preparing the substrate 41 consisting of n-type GaAs first and sequentially growing the buffer layer 42 of n-type ZnSe, the n-type layer 43 of n-type ZnMgSSe mixed crystal, the I layer 44 of ZnSSe mixed crystal without any impurity, the p-type layer 45 of p-type ZnSSe mixed crystal, the ZnSe cap layer 46 of p-type ZnSe mixed crystal, the compositional gradient super-lattice layer 47 consisting of the p-type ZnTe layer and the p-type ZnSe layer, and the low defect contact layer 48 of p-type ZnTe on one side of the substrate 41, (001) according to the MBE method.

The plurality of parallel square-like mask patterns is formed which is extended toward the <110> direction by using lithography after applying a resist film, not shown, on the low defect contact layer 48. After wet-etching or dry etching using the resist film, not shown, as a mask, the low defect contact layer 48, the compositional gradient super-lattice layer 47 and ZnSe cap layer 46 are removed sequentially and selectively to form the plurality of parallel square-like shape which is extended in the <110> direction. Then, the insulating layer 49 is formed by forming aluminum oxide film by the vacuum evaporation method, for example, on the whole surface (i.e. on the p-type layer 45 from which the low defect contact layer 48 and the like are removed selectively and on the resist film, not shown,) and removing, or lifting off, the resist film, not shown, together with aluminum oxide film formed on the resist film.

After forming the insulating layer 49, the thin film electrode 50 is formed by evaporating the metallic layer on the low defect contact layer 48 and the insulating layer 49 by the vacuum evaporation method, for example. After forming the thin film electrode 50, a square-like mask pattern which is a little smaller than the low defect contact layer 48 is formed by applying the resist film, not shown, on the thin film electrode 50 and using photo-lithography to correspond to the low defect contact layer 48. Then, the p-side electrode 51 is formed by sequentially evaporating a palladium layer, a platinum layer and a metallic layer by the vacuum evaporation method, for example, on the whole surface (i.e. on the thin film electrode 50 and on the resist film, not shown,) and removing, or lifting off, the resist film, not shown, together with the palladium layer, the platinum layer and the metallic layer formed on the resist film. After forming the p-side electrode 51, the n-side electrode 52 is formed by evaporating an indium layer by the vacuum evaporation method, for example on the other side of the substrate 11. Then, the n-side electrode 52 is heat-processed.

The substrate 41 is cleaved in parallel with each edge of the square-like shape of the low defect contact layer 48, respectively, to form the photo-diode shown in FIG. 2.

The photo-diode thus manufactured as above works as follows.

In this photo-diode, when electron-hole pairs are occurred by light absorbed mainly on the I layer 44, the electrons travel to the direction of n-type layer 43, and the holes travel to the p-type layer 45, by being led by an electric field which is applied between the n-side electrode 52 and the p-side electrode 51. In other words, it causes current which travels from the n-type layer 43 through the p-type layer 45, the ZnSe cap layer 46, the compositional gradient super-lattice layer 47, and the low defect contact layer 48 to the thin film electrode 50 and the p-side electrode 51. Here, the low defect contact layer 48 is equipped adjacent to the compositional gradient super-lattice layer 47 and the thickness of the low defect contact layer 48 is thin as much as 5 nm or less. Therefore, the defect density of the low defect contact layer 48 is low and has many hole-traps. Thus, high quantum efficiency can be obtained.

In the photo-diode according to the present invention, the low defect contact layer 48 is formed adjacent to a compositional-gradient super-lattice layer 47, and the thickness of the low defect contact layer 48 is 5 nm or less here. Thus, the defect density of the low defect contact layer is reduced, and a high quantum efficiency and high reliability can be obtained.

While the present invention has been described in connection with the preferred embodiment thereof, it will be understood that it is not intended to limit the invention to that embodiment and can be modified differently. For example, the first embodiment specifically describes II-VI family chemical compound semiconductor which constructs the buffer layer 12, the n-type clad layer 13, the first guide layer 14, the active layer 15, the second guide layer 16, the p-type clad layer 17, and the ZnSSe cap layer 18, respectively. However, those of each layer can be constructed by other appropriate II-VI family compound semiconductors (i.e. II-VI family compound semiconductor including at least one kind of II family chemical element selected from a group consisting of zinc, magnesium, cadmium, manganese, mercury and beryllium and at least one kind of VI family chemical element selected from a group consisting of oxygen, selenium, sulfur and tellurium.) This is the same for the buffer layer 42, the n-type layer 43, the I layer 44 and the p-type layer 45 according to the second embodiment.

Also, each of embodiments describes an example of construction of a laser diode or a photo-diode. However, the present invention can be widely applicable to a laser diode or photo-diode with other construction if it has ZnSe cap layers 19 and 46 of p-type ZnSe, compositional gradient super-lattice layers 20 and 47 consisting of a p-type ZnTe layer and a p-type ZnSe layer, and low defect contact layers 21 and 48 of p-type ZnTe. Compositional gradient super-lattice layers 20 and 47 and low defect contact layers 21 and 48 must be placed adjacent to ZnSe cap layers 19 and 46 and compositional gradient super-lattice layers 20 and 47, respectively.

In addition, in the fist embodiment, the laser diode, LD, only as a semiconductor light-emitting element is described. However, the present invention can be applicable to the other semiconductor light-emitting element such as light-emitting diode, LED. Also, the second embodiment only describes a photo-diode as a semiconductor photoreceptor device. However, the present invention is similarly applicable to other semiconductor photoreceptor devices.

Furthermore, the present invention is not limited to a semiconductor light-emitting element and a semiconductor photoreceptor device. The present invention is widely applicable to a semiconductor element consisting of a first layer with ZnSe body crystal, a compositional gradient super-lattice layer in which a ZnTe layer with ZnTe body crystal and a ZnSe layer with ZnSe body crystal are laminated alternately to the first layer and a second layer with ZnTe body crystal being placed adjacent to the compositional gradient super-lattice layer. The body crystal constructs the first layer, the compositional gradient layer and the second layer and may be with a p-type or n-type impurity or may be without any impurities.

Still further, each embodiment describes the case when the low defect contact layers 21 and 48 of ZnTe are laminated on the ZnSe cap layers 19 and 46 of p-type ZnSe. However, the present invention is widely applicable to the case when crystals with largely different lattice constants, such as ZnSe and ZnTe, are laminated. For example, when the second layer with a SiGe body crystal is laminated on the first layer with an Si body crystal, the defect density in the second layer can be reduced if the second layer is formed with sandwiching a super-lattice layer in which an Si layer whose body crystal consists of Si and a Ge layer whose body crystal consists of a germanium (Ge), are alternately laminated and is formed with thickness less than the predetermined thickness.

Also, when the second layer with an InAs body crystal is laminated on the first layer with a GaAs body crystal, the defect density in the second layer can be reduced if the second layer is formed with sandwiching a super-lattice layer in which an GaAs layer with GaAs body crystal and an InAs layer with an InAs body crystal are alternately laminated with under the predetermined thickness. Furthermore, when the second layer with an InN body crystal is laminated on the first layer with a GaN body crystal, the defect density in the second layer can be reduced if the second layer is formed with sandwiching a super-lattice layer in which an GaN layer with GaN body crystal and an InN layer with an InN body crystal are alternately laminated with thickness less than predetermined thickness.

Still further, each embodiment describes the case when the MBE method is used for growing each II-VI family compound semiconductor layer. However, the Metal Organic Chemical Vapor Deposition, MOCVD, method may be used.

According to the semiconductor element of the present invention, the second layer is formed through the compositional gradient super-lattice layer, and it is formed to be 5 nm or less in thickness. Thus, it can reduce the defect density of the second layer and improved the characteristic of the element.

In addition, according to the semiconductor emitting element of the present invention, the low defect contact layer is formed adjacent to the compositional gradient super-lattice layer and is formed to be 5 nm or less in thickness. Thus, it can reduce the defect density of the low defect contact layer, and especially it can suppress increase in the operational voltage immediately after energization.

Therefore, the operational voltage becomes lower so that the lifelong of the element can be extended. Also, it can obtain good characteristics so that it improves realiability.

Furthermore, according to the semiconductor element of the present invention, the low defect contact layer is formed adjacent to the compositional gradient super-lattice layer and is formed to be 5 nm or less in thickness. Thus, it can reduce the defect density of the low defect contact layer. It can obtain high quantum efficiency and high reliability.

What is claimed is:

1. A semiconductor element, comprising:

a first layer whose body crystal is ZnSe, a compositional gradient super-lattice layer which is placed adjacent to the first layer, in which a ZnTe layer whose body crystal is a ZnTe and a ZnSe layer whose body crystal is ZnSe are alternately laminated more than two layers for each couple of layers, wherein the thickness of at least one of ZnTe layer and ZnSe layer varies in the direction of laminated layers to have a compositional difference, and a second layer which is placed adjacent to the compositional gradient super-lattice layer, wherein the second layer whose body crystal is ZnTe and is 5 nm or less in thickness.

2. A semiconductor light-emitting device in which an n-type clad layer, an active layer, a p-type clad layer comprising at least one kind of II family chemical elements including zinc (Zn), magnesium (Mg), beryllium(Be), cadmium (Cd), mercury (Hg) and manganese (Mn) and at least one kind of VI family chemical elements including oxygen (O), sulfur (S), selenium (Se) and tellurium (Te) are at least sequentially laminated, and a p-side electrode is electrically connected to the p-type clad layer, the semiconductor light-emitting device comprising:

a ZnSe cap layer which is placed between the p-type clad layer and the p-side electrode and consisting of p-type ZnSe;

a compositional gradient super-lattice layer which is placed adjacent to the ZnSe cap layer and between the ZnSe cap layer and the p-side electrode, wherein the thickness of at least one of p-type ZnTe layer and p-type ZnSe layer varies in the direction of laminated layers to have a compositional slope; and a low defect contact layer which is placed adjacent to the compositional gradient super-lattice layer and between the compositional gradient super-lattice layer and the p-side electrode, wherein the low defect contact layer consists of p-type ZnTe and is 5 nm or less in thickness.

3. A semiconductor photoreceptor device in which an n-type layer, an I layer, a p-type layer comprising at least one kind of II family chemical elements including zinc (Zn), magnesium (Mg), beryllium (Be), cadmium (Cd), mercury (Hg) and manganese (Mn) and at least one kind of VI family chemical elements including oxygen (O), sulfur (S), selenium (Se) and tellurium (Te) are at least sequentially laminated, and a p-side electrode is electrically connected to the p-type layer, comprising:

a ZnSe cap layer which is placed between the p-type layer and the p-side electrode and consisting of p-type ZnSe;

a compositional gradient super-lattice layer which is placed adjacent to the ZnSe cap layer and between the ZnSe cap layer and the p-side electrode, wherein the p-type ZnTe layer and p-type ZnSe layer are laminated alternately at least two layers for each couple of layers, and the thickness of at lease one of ZnTe layer and ZnSe layer varies in the direction of laminated layers to have a compositional difference; and a low defect contact layer which is placed adjacent to the compositional gradient super-lattice layer and between the compositional gradient super-lattice layer and the p-side electrode, wherein the low defect contact layer consists of p-type ZnTe and is 5 nm or less in thickness.

* * * * *